United States Patent
Tomar et al.

(10) Patent No.: US 12,404,584 B2
(45) Date of Patent: Sep. 2, 2025

(54) PARALLEL ATOMIC LAYER DEPOSITION OF TARGET ELEMENT INTERIORS

(71) Applicant: Applied Materials, Inc., Santa Clara, CA (US)

(72) Inventors: Yogesh Tomar, Madhya Pradesh (IN); Nikshep Patil, Hubballi (IN); Kirubanandan Shanmugam Naina, Bangalore (IN); Hanish Kumar Panavalappil Kumarankutty, Karnataka (IN); Gayatri Natu, Maharashtra (IN); Mahesh Chelvaraj Arcot, Maharashtra (IN); Senthil Kumar Nattamai Subramanian, Hosur (IN); Hari Venkatesh Rajendran, Tamil Nadu (IN); Michael Rice, Pleasanton, CA (US); Christopher Laurent Beaudry, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/223,199

(22) Filed: Jul. 18, 2023

(65) Prior Publication Data

US 2025/0027195 A1    Jan. 23, 2025

(51) Int. Cl.
   *C23C 16/455*    (2006.01)
   *C23C 16/44*    (2006.01)
   *C23C 16/52*    (2006.01)

(52) U.S. Cl.
   CPC .... *C23C 16/45529* (2013.01); *C23C 16/4408* (2013.01); *C23C 16/45553* (2013.01); *C23C 16/52* (2013.01)

(58) Field of Classification Search
   CPC .......... C23C 16/45529; C23C 16/4408; C23C 16/45553; C23C 16/52
   See application file for complete search history.

(56) References Cited

U.S. PATENT DOCUMENTS

| 5,308,399 A | 5/1994 | Pillhoefer et al. |
| 6,042,652 A | 3/2000 | Hyun et al. |

(Continued)

FOREIGN PATENT DOCUMENTS

| CN | 109778143 B | 5/2021 |
| KR | 101787825 B1 | 11/2017 |
| WO | 2022174243 A1 | 8/2022 |

OTHER PUBLICATIONS

International Search Report and Written Opinion for International Application No. PCT/US2023/034587, mailed Feb. 7, 2024, 09 Pages.

(Continued)

*Primary Examiner* — Kelly M Gambetta
(74) *Attorney, Agent, or Firm* — Lowenstein Sandler LLP

(57) ABSTRACT

A method includes performing an atomic layer deposition (ALD) process with respect to a plurality of target elements to coat interiors of the plurality of target elements with a protective coating. Performing the ALD process includes alternating delivery of a first precursor inside the plurality of target elements for a first duration to form an adsorption layer on the interiors of the plurality of target elements, alternating purging of the first precursor from the plurality of target elements for a second duration, and alternating delivery of a second precursor inside the plurality of target elements for a third duration to cause the second precursor to react with the adsorption layer and form a target layer on the interiors of the plurality of target elements.

14 Claims, 9 Drawing Sheets

(56) References Cited

U.S. PATENT DOCUMENTS

| | | | |
|---|---|---|---|
| 10,186,400 B2 | 1/2019 | Wu et al. | |
| 10,443,126 B1 | 10/2019 | Wu et al. | |
| 10,573,497 B2 | 2/2020 | Wu et al. | |
| 10,858,741 B2 | 12/2020 | He et al. | |
| 11,251,023 B2 | 2/2022 | Wu et al. | |
| 2008/0113097 A1 | 5/2008 | Mahajani et al. | |
| 2014/0127404 A1 | 5/2014 | Yudovsky et al. | |
| 2014/0165910 A1 | 6/2014 | Shin et al. | |
| 2015/0017812 A1* | 1/2015 | Chandrasekharan | C23C 16/45544 438/762 |
| 2019/0136372 A1 | 5/2019 | Zhan et al. | |
| 2019/0338418 A1 | 11/2019 | Goradia et al. | |
| 2019/0382888 A1 | 12/2019 | Wu et al. | |
| 2020/0181771 A1* | 6/2020 | Wu | C23C 16/45555 |
| 2021/0301395 A1 | 9/2021 | Wu et al. | |
| 2022/0251704 A1 | 8/2022 | Salinas et al. | |
| 2022/0282375 A1 | 9/2022 | Price | |

OTHER PUBLICATIONS

International Search Report and Written Opinion for International Application No. PCT/US2024/010645, mailed May 8, 2024, 10 Pages.

* cited by examiner

PARALLEL ATOMIC LAYER DEPOSITION OF TARGET ELEMENT INTERIORS

TECHNICAL FIELD

The present disclosure relates, in general, to a method and hardware for parallel atomic layer deposition (ALD) of target element interiors. In particular, the present disclosure relates to a method and hardware for rapidly coating interiors of target elements with a protective coating using ALD.

BACKGROUND

Semiconductor substrates are commonly processed in processing systems. These systems include one or more processing chambers, each performing substrate processing operations such as etching, chemical vapor deposition, or physical vapor deposition, which can include temperature and pressure cycling as well as introduction of a variety of chemical components into the chambers. Some processing chambers also include a gas panel to perform the substrate processing operations. The processing chambers undergo regular maintenance and the health of such processing chambers is regularly monitored.

The gas panels in the processing chambers are subject to transporting a variety of gases throughout the processing chamber. These gases include corrosive gases that are harmful to gas tubes that transport the corrosive gases to the processing chamber. Protective coatings can be applied to the interiors of the gas tubes to protect against corrosive gases.

SUMMARY

In some embodiments of the present disclosure, a method includes performing an atomic layer deposition (ALD) process with respect to a plurality of target elements to coat interiors of the plurality of target elements with a protective coating. Performing the ALD process includes alternating delivery of a first precursor inside each of the plurality of target elements for a first duration to form an adsorption layer on the interiors of the plurality of target elements. Performing the ALD process further includes alternating purging of the first precursor from the plurality of target elements for a second duration. The purging is performed for a first target element of the plurality of target elements while delivery of the first precursor is performed for a second target element of the plurality of target elements. Performing the ALD process further includes alternating delivery of a second precursor inside each of the plurality of target elements for a third duration to cause the second precursor to react with the adsorption layer and form a target layer on the interiors of the plurality of target elements. The delivery of the second precursor is performed for the first target element while purging is performed for the second target element or a third target element of the plurality of target elements.

In some embodiments of the present disclosure, a system includes a distribution panel, a plurality of valves, and a plurality of distribution blocks configured to receive a first precursor, a second precursor, and a purge gas from the distribution panel via a plurality of conduits. The plurality of distribution blocks are further configured to deliver the first precursor, the second precursor, and the purge gas to a plurality of target elements. The system further includes a memory and a processing device operatively coupled to the memory. The processing device is to cause alternating delivery of the first precursor inside each of the plurality of target elements for a first duration to form an adsorption layer on interiors of the plurality of target elements. The processing device is further to cause alternating purging of the first precursor from the plurality of target elements for a second duration. The purging is performed for a first target element of the plurality of target elements while delivery of the first precursor is performed for a second target element of the plurality of target elements. The processing device is further to cause alternating delivery of the second precursor inside each of the plurality of target elements for a third duration to cause the second precursor to reach with the adsorption layer and form a target layer on the interiors of the plurality of target elements. The delivery of the second precursor is performed for the first target element while purging is performed for the second target element or a third target element of the plurality of target elements.

In some embodiment of the present disclosure, a non-transitory computer readable medium includes instructions that, when executed by a processing device, cause the processing to perform operations including causing performance of an ALD process with respect to a plurality of target elements to coat interiors of the plurality of target elements with a protective coating. Performing the ALD process includes alternating delivery of a first precursor inside each of the plurality of target elements for a first duration to form an adsorption layer on the plurality of target elements. Performing the ALD process further includes alternating purging of the first precursor from the plurality of target elements for a second duration. The purging is performed for a first target element of the plurality of target elements while delivery of the first precursor is performed for a second target element of the plurality of target elements. Performing the ALD process further includes alternating delivery of a second precursor inside each of the plurality of target elements for a third duration to cause the second precursor to react with the adsorption layer and form a target layer on the interiors of the plurality of target elements. The delivery of the second precursor is performed for the first target element while purging is performed for the second target element or a third target element of the plurality of target elements.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
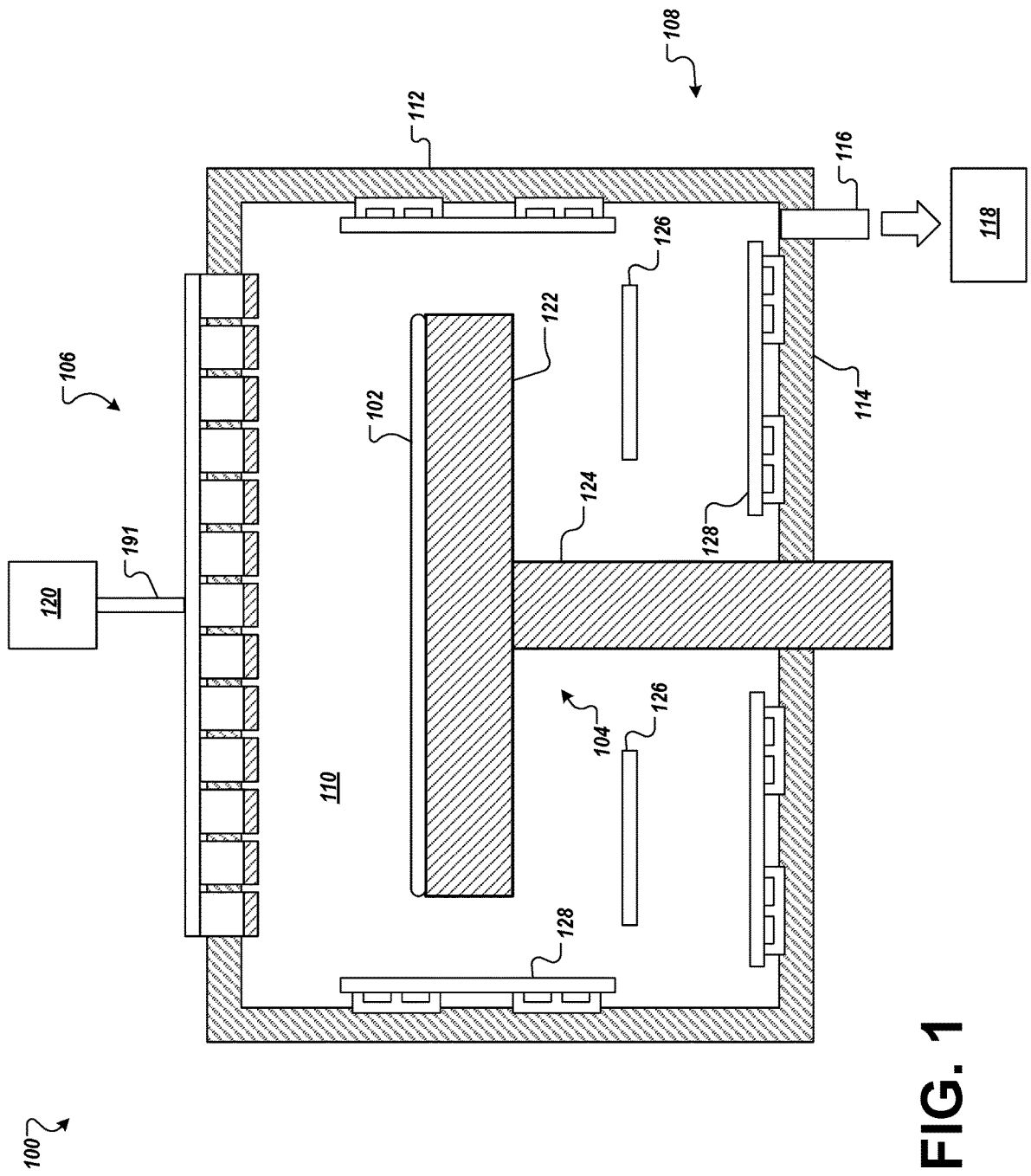
FIG. 1 depicts a sectional view of a manufacturing chamber, according to certain embodiments of the present disclosure.

Described herein is a method and a system for parallel ALD of target element interiors. Some embodiments described herein relate to coating interiors of multiple target elements, such as gas delivery tubes, with a protective coating using an ALD process. In some embodiments, the coating of the interiors is performed at the same time or at least substantially at the same time (e.g., in parallel).

Substrate processing systems often include multiple gas tubes to deliver gases from a gas distribution panel to process chambers. Such gas tubes often deliver gases that are corrosive to the gas tubes. Protective coatings can be applied to the interior of the gas tubes prior to installation in the substrate processing system so that the gas tubes can better withstand corrosive effects of the gases. Additionally, protective coatings can be applied to the interiors of other chamber components, such as showerheads, gas distribution plates (GDPs), and other components that have one or more through interior surface to be coated (e.g., interior surfaces with an entrance opening and an exit opening). Conventionally, gas tubes are coated in sequence (e.g., one at a time, etc.), being subject to long cycle times. Existing ALD systems are not capable of forming coatings on the interiors of gas tubes, which have high aspect ratios of length to width/diameter, in a timely and efficient manner. Ultimately, conventional approaches to applying protective coatings in gas tubes are slow and/or have low throughput. Improving throughput would be advantageous.

In some embodiment, the systems and methods of the present disclosure provide for the parallel coating of the interiors of multiple target elements—such as gas tubes— with a protective coating. In some embodiments, a system for coating interiors of target elements with a protective coating includes a distribution panel, multiple valves, and multiple distribution blocks. The multiple distribution blocks are configured to receive a first precursor, a second precursor, and a purge gas from the distribution panel via multiple conduits. In some embodiments, the multiple valves can open and/or close to control the flow of the first precursor, the second precursor, and/or the purge gas to the multiple distribution blocks. Additionally, for ALD processes that distribute multiple layers of different compositions, additional precursors such as a third precursor, fourth precursor, and so on may also be provided to the multiple distribution blocks via use of one or more additional valves. The multiple valves are controllable by a controller (e.g., the controller can control the position of the valves). In some embodiments, the multiple distribution blocks are further configured to deliver the first precursor, the second precursor, any other precursors, and/or the purge gas to multiple target elements. In some embodiments, a target element is fluidly coupled to each of the distribution blocks. A target element may be a substrate processing hardware component, such as a gas tube (e.g., a gas delivery tube), a showerhead, a GDP, and so on. In some embodiments, the target elements have a high aspect ratio, meaning the target elements are much longer than they are wide. Example aspect ratios of length to width or diameter for components (e.g., gas conduits) to be coated may be 10:1, 50:1, 100:1 or greater in some embodiments. In some embodiments, the target elements are coupled to the distribution blocks in parallel with one another (e.g., the target elements are in parallel).

In some embodiments, the system further includes a controller that may include a memory, and a processing device operatively coupled to the memory. In some embodiments, the processing device is to carry out instructions stored in the memory. In some embodiments, the processing device is to cause alternating delivery of the first precursor inside each of the target elements for a first duration. The processing device may cause one or more valves to open and/or close to alternate delivery of the first precursor among the multiple target elements (e.g., via the multiple distribution blocks). In some embodiments, the first precursor is a first ALD precursor such as trimethyl aluminum (TMA) or aluminum chloride. Delivering the first precursor inside the target elements may cause an adsorption layer to form on the interiors of the target elements. In some embodiments, one or more valves are opened to flow the first precursor into the interiors of the target elements. In some embodiments, a first target element receives the first precursor at a first time and a second target element receives the first precursor at a later second time.

In some embodiments, the first precursor is pulsed inside the target elements for the first duration. In some embodiments, the pulsing the first precursor inside the target elements includes a rastering of pulsing to the various target elements. In some embodiments, rastering of pulsing is to time sequence the introduction of the first precursor into the target elements. In some embodiments, a first valve is opened and subsequently closed to pulse the first precursor inside the first target element (e.g., via a first distribution block), and a second valve is opened and subsequently closed to pulse the first precursor inside the second target element (e.g., via a second distribution block). In some embodiments, the second valve is opened after the first valve is closed so that a pressure wave in the first precursor supply settles before the second valve is opened. In some embodiments, the first precursor is pulsed inside multiple target elements via the multiple distribution blocks.

In some embodiments, the processing device is to cause alternating purging of the first precursor from the multiple target elements. The processing device may cause one or more valves to open and/or close to alternate delivery of purge gas among the multiple target elements (e.g., via the multiple distribution blocks). In some embodiments, the purge gas is an inert gas such as nitrogen. In some embodiments, one or more valves are opened to flow the purge gas into the interiors of the target elements. In some embodiments, the purge gas is caused to flow into the target elements subsequent to the pulsing of the first precursor.

In some embodiments, the purge is caused to flow inside the target elements for a second duration. The second duration that the purge gas is flowed may be longer than the first duration that the first precursor is pulsed in some embodiments. In some embodiments, a valve is opened to purge the first precursor from inside the first target element and another valve is opened to purge the first precursor from inside the second target element. In some embodiments, the purge gas is flowed into the first target element and the second target element at the same time to purge the first precursor. However, purging of the second target element may be delayed from the beginning of the purging of the first target element because of the delay in the pulsing of the first precursor. In some embodiments, the first precursor is purged from the first target element while the first precursor is delivered to the second target element. Thus, purging of the first target element may at least partially overlap in time with flowing the first precursor in the second target element.

In some embodiments, the processing device is to cause alternating of the second precursor inside the target elements for a third duration. The processing device may cause one or more valves to open and/or close to alternate delivery of a second precursor inside each of the target elements for a third duration. The processing device may cause one or more valves to open and/or close to alternate delivery of the second precursor among the multiple target elements. In some embodiments, the second precursor is a second ALD precursor or reactant (e.g., such as an oxidant for a fluoride-containing precursor) such as water ($H_2O$) or ozone ($O_3$). Delivering the second precursor inside the target elements may cause the second precursor to react with the adsorption layer to form a target layer on the interiors of the target elements. In some embodiments, the target layer forms at least a portion of the protective coating on the interiors of the target elements. In some embodiments, one or more valves are opened to flow the second precursor into the interiors of the target elements. In some embodiments, a first target element receives the second precursor at a third time (e.g., later than the first and second times described above) and the second target element receives the second precursor at a later fourth time.

In some embodiments, the second precursor is pulsed inside the target elements for a third duration. The third duration that the second precursor is pulsed may be similar (e.g., substantially similar) to the first duration that the first precursor is pulsed. In some embodiments, the pulsing the second precursor inside the target elements includes a rastering of pulsing to the various target elements. In some embodiments, a third valve is opened and subsequently closed to pulse the second precursor inside the first target element and a fourth valve is opened and subsequently closed to pulse the second precursor inside the second target element. In some embodiments, the fourth valve is opened after the third valve is closed so that a pressure wave in the second precursor supply settles before the fourth valve is opened. In some embodiments, the second precursor is pulsed inside multiple target elements via the multiple distribution blocks.

In some embodiments, pulsing of the second precursor inside the first target element is performed while the purging is performed with respect to the second target element and/or with respect to a third target element. Thus, pulsing of the second precursor inside the first target element may overlap in time with the purging of the second target element and/or the third target element.

Aspects of the present disclosure result in technological advantages compared to conventional solutions. Particularly, aspects of the present disclosure result in greater throughput of manufactured target elements having a protective coating on the interior applied by ALD. Because pulsing a first precursor, purging, and/or pulsing a second precursor inside multiple target elements can be accomplished at the same time, according to embodiments described herein, cycle time for producing batches of target elements having a protective coating on the interior can be reduced, resulting in faster production and greater throughput than conventional approaches. Additionally, by coupling target elements in parallel with a common distribution panel (e.g., source of first precursor, second precursor, and/or purge gas), gas distribution conduits and associated architecture can be simplified, resulting in a decreased cost of the overall system and less maintenance. Because of the simplified system architecture, the system may also experience reduced unscheduled down time.

FIG. 1 depicts a sectional view of a manufacturing chamber 100 (e.g., a semiconductor processing chamber) according to some aspects of this disclosure. Manufacturing chamber 100 may be one or more of an etch chamber (e.g., a plasma etch chamber), deposition chamber (including atomic layer deposition, chemical vapor deposition, physical vapor deposition, or plasma enhanced versions thereof), anneal chamber, or the like. For example, manufacturing chamber 100 may be a chamber for a plasma etcher, a plasma cleaner, atomic layer deposition (ALD) device, chemical vapor deposition (CVD) device, and so forth. Examples of chamber components may include a substrate support assembly 104, an electrostatic chuck, a ring (e.g., a process kit ring), a chamber wall, a base, a showerhead 106, a gas distribution plate, a liner, a liner kit, a shield, a plasma screen, a flow equalizer, a cooling base, a chamber viewport, a chamber lid, a nozzle and so on.

In one embodiment, manufacturing chamber 100 may include a chamber body 108 and a showerhead 106 that enclose an interior volume 110. In some chambers, showerhead 106, may be replaced by a lid and a nozzle. Chamber body 108 may be constructed from aluminum, stainless steel, or other suitable material. Chamber body 108 generally includes sidewalls 112 and a bottom 114.

An exhaust port 116 may be defined in chamber body 108, and may couple interior volume 110 to a pump system 118. Pump system 118 may include one or more pumps and valves utilized to evacuate and regulate the pressure of interior volume 110 of manufacturing chamber 100. An actuator to control gas flow out of the chamber and/or pressure in the chamber may be disposed at or near exhaust port 116.

Showerhead 106 may be supported on sidewalls 112 of chamber body 508 or on a top portion of the chamber body. Showerhead 106 (or the lid, in some embodiments) may be opened to allow access to interior volume 110 of manufacturing chamber 100, and may provide a seal for manufacturing chamber 100 while closed.

Gas panel 120 may be coupled to manufacturing chamber 100 via one or more gas delivery lines (also referred to as supply lines) 191 to provide process or cleaning gases to interior volume 110 through showerhead 106 (or lid and nozzle). The gas panel 120 may be coupled to the manufacturing chamber 100 to provide process and/or cleaning gases via one or more supply lines to the interior volume 110 through showerhead 106. In some embodiments, the supply line(s) 191 coupling the gas panel 120 to the manufacturing chamber 100 may include a protective coating on an inner surface (e.g., an interior surface). Other chamber components with high aspect ratio features such as the showerhead 106 may have interior channels that are coated with the protective coating. The protective coating may protect the interior of the supply line(s) 191, showerhead 106, etc. from corrosive gases and/or precursors delivered from the gas panel 120 to the manufacturing chamber 100. The protective coating may be an aluminum oxide coating in one embodiment. Other examples of protective coatings include yttrium oxide, $Y_3Al_5O_{12}$ yttrium aluminum garnet (YAG), a ceramic compound comprising a solid-solution of $Y_2O_3$—$ZrO_2$, a ceramic compound comprising $Y_4Al_2O_9$ and a solid-solution of $Y_2O_3$—$ZrO_2$, and so on. In some embodiments, the protective coating is deposited on one or more interior surfaces of the supply line(s) by an atomic layer deposition (ALD) process as described herein.

The gas panel 120 may include or be connected to one or more flow control apparatus. The flow control apparatus(es) may be used to measure and control the flow of one or more gasses from one or more gas sources to interior volume 110. In one embodiment, the gas panel 120 includes multiple gas stick assemblies. Each gas stick assembly may include one or more valves, filters, mass flow controllers (MFCs) and/or other components.

Showerhead 106 may include multiple gas delivery holes throughout. Examples of processing gases that may be used to process substrates in manufacturing chamber 100 may include toxic gases, non-toxic gases, or a combination thereof. For example, the processing gases may include halogen-containing gases, such as $C_2F_6$, $SF_6$, $SiCl_4$, HBr, $NF_3$, $CF_4$, $CHF_3$, $F_2$, $Cl_2$, $CCl_4$, $BCl_3$, and $SiF_4$, among others, and other gases such as $O_2$ or $N_2O$. Examples of carrier gases include $N_2$, He, Ar and other gases inert to process gases (e.g., non-reactive gases).

Substrate support assembly 104 may be disposed in interior volume 110 of manufacturing chamber 100 below showerhead 106. In some embodiments, substrate support assembly 104 includes a susceptor 122 and shaft 124. Substrate support assembly 104 supports a substrate during processing. In some embodiments, also disposed within manufacturing chamber 100 are one or more heaters 126 and reflectors 128.

In some embodiments, showerhead 106 is configured to produce plasma via RF discharge. Maximum power delivery depends on matching impedance between the RF source and the plasma. Impedance matching may be performed by a closed loop control system. Sensors measuring properties related to the RF impedance matching (RF match) may be monitored. Impedance within manufacturing chamber 100 is highly correlated with chamber pressure. Monitoring properties related to RF impedance matching (e.g., RF match voltage, RF match current, RF match capacitor position) may provide insight into the pressure inside the manufacturing chamber.

Figure 2:
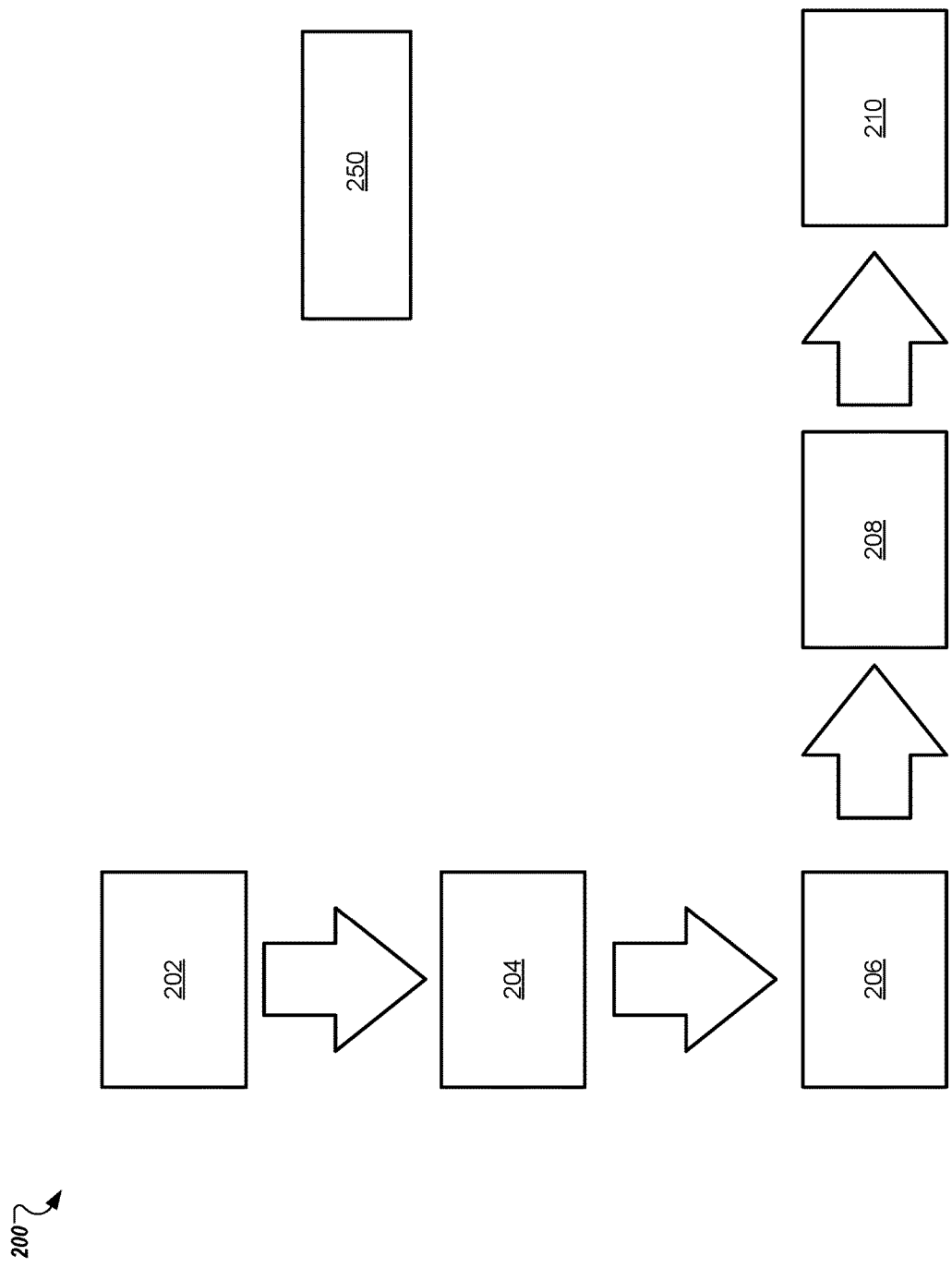
FIG. 2 illustrates a simplifies flow diagram of a system for coating an interior of a target element with a protective coating, according to certain embodiments of the present disclosure.

FIG. 2 illustrates a simplified gas flow diagram of a system 200 for coating an interior of a target element with a protective coating, according to certain embodiments of the present disclosure. In some embodiments, a gas panel 202 is a source of gas to a gas distribution system 204. Gas panel 202 may provide a supply of a first precursor (e.g., a gas containing a first precursor), a second precursor, one or more additional precursors, and/or a purge gas to gas distribution system 204. In some embodiments, gas panel 202 may provide a supply of liquid, such as liquid water, to gas distribution system 204.

In some embodiments, gas distribution system 204 includes multiple conduits to supply the first precursor, the second precursor, one or more additional precursors, and/or the third precursor from the gas panel 202 to the one or more target elements 206. In some embodiments, gas distribution system 204 includes multiple valves to control flow of precursors and/or purge gas to target elements 206. In some embodiments, one or more distribution blocks receive the precursors and/or purge gas from the valves and distribute the precursors and/or purge gas to the target elements 206. In some embodiments, a target element 206 is fluidly coupled to a distribution block of gas distribution system 204. In some embodiments, controller 250) causes valves to open and/or to close to pulse precursor into the interiors of target elements 206 and/or to deliver purge gas into the target elements 206. In some embodiments, the target elements 206 are gas distribution tubes of a substrate processing facility. By flowing one or more precursors through the interiors of target elements 206, a protective coating may be formed on one or more interior surfaces of the target elements 206.

In some embodiments, a vacuum pump 208 evacuates precursors and/or purge gas from the target elements 206. In some embodiments, the vacuum pump 208 maintains vacuum within the target elements 206. In some embodiments, spent precursor and/or purge gas may be provided from the vacuum pump 208 to an abatement fixture 210 for disposal.

Figure 3:
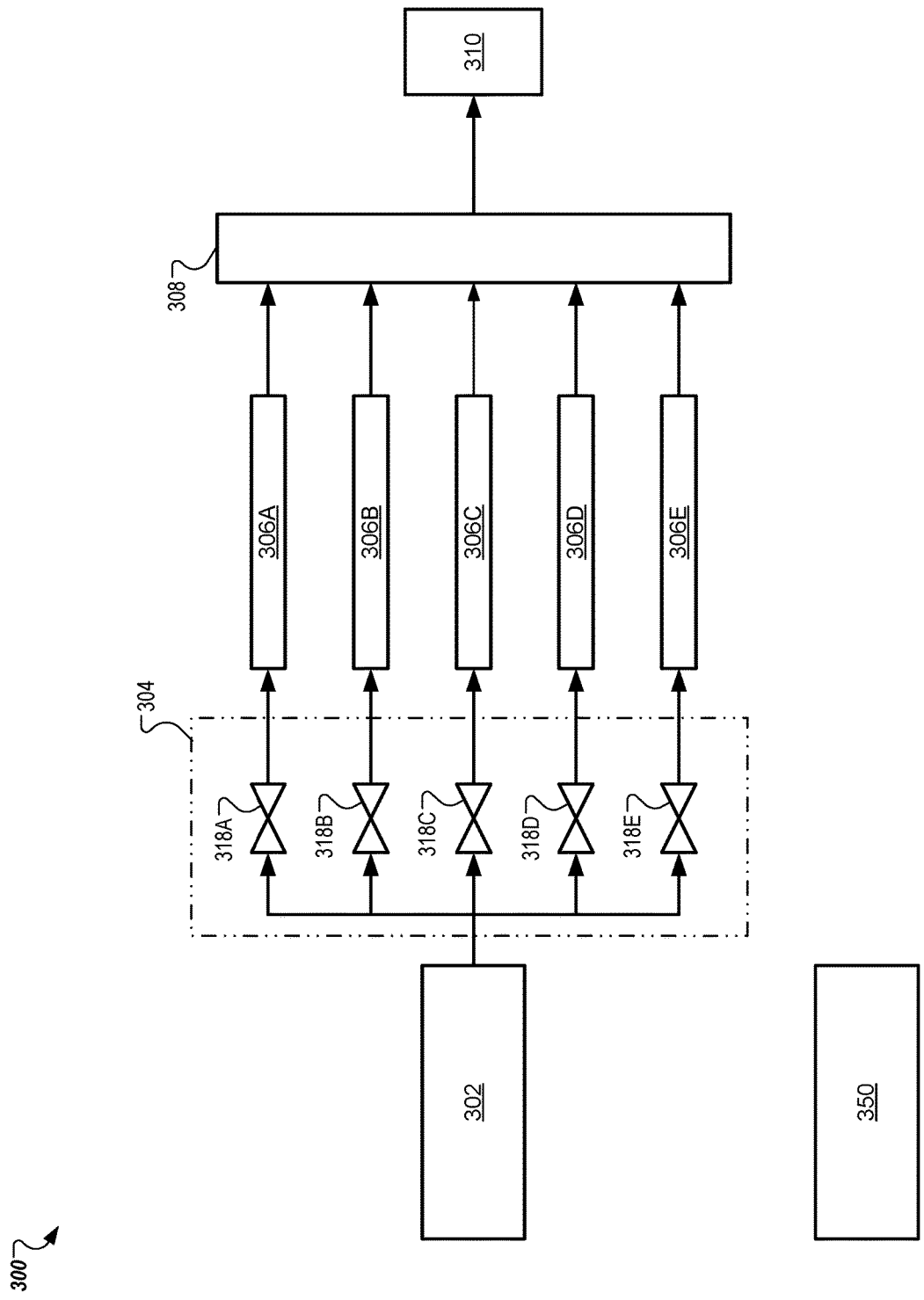
FIG. 3 illustrates a schematic diagram of a system for coating interiors of target elements with a protective coating, according to certain embodiments of the present disclosure.

FIG. 3 illustrates a schematic diagram of a system 300 for coating interiors of target elements with a protective coating, according to certain embodiments of the present disclosure. Features illustrate in FIG. 3 having similar numbering to features illustrated in other figures may have similar function and/or structure.

In some embodiments, a gas panel 302 provides a source of gas to gas distribution system 304. In some embodiments, gas panel 302 provides a source of precursors and/or purge gas(es) for performing an ALD process. For example, gas panel 302 may provide a source of a first precursor, a purge gas, and/or a second precursor. In some embodiments, gas distribution system 304 receives precursor(s) and/or purge gas from gas panel 302 and provides the precursor(s) and/or purge gas to the target elements 306A-E.

In some embodiments, gas distribution system 304 includes multiple valve 318A-E that are to control the flow of the precursor(s) and/or purge gas. Controller 350 may control the opening and/or closing of valves 318A-E. In some embodiments, controller 350) controls the timing of the opening and closing of valves 318A-E. In some embodiments, controller 350 causes valves 318A-E to open to pulse a first precursor in the interiors of target elements 306A-E. In some embodiments, controller 350) causes pulsing of the first precursor to alternate between target elements 306A-E. In some embodiments, controller 350 causes rastering of pulsing of the first precursor between target elements 306A-E. Rastering of pulsing may include pulsing the first precursor into target element 306A at a first time, pulsing the first precursor into target element 306B at a later second time, pulsing the first precursor into target element 306C at a later third time, etc. In some examples, controller 350) causes valve 318A to open at a first time to deliver a first precursor to target element 306A for a first duration. Controller 350 may cause valve 318A to close and may then cause valve 318B to open for the first duration. Controller 350 may cause valve 318B to close and may then cause valve 318C to open for the first duration, and so on.

In some embodiments, the controller 350 causes the first precursor to be pulsed inside the target elements 306A-E for a first duration. The first duration may be a time duration between approximately 10 milliseconds and approximately 50 milliseconds. In some embodiments, pulsing of the precursor inside target element 306B is delayed relative to the pulsing of the precursor inside target element 306A by an offset delay. Similarly, pulsing of the precursor inside target element 306C may be delayed relative to the pulsing of the precursor inside target element 306B by an offset delay, and so on. In some embodiments, the offset delay is between approximately 100 milliseconds and approximately 500 milliseconds. Delaying pulsing of precursor by the offset delay may allow for a pressure disturbance (e.g., a pressure wave, pressure variance, etc.) inside gas distribution system 304 to settle before pulsing the precursor in the next target element in sequence. Doing so may provide for consistent pulses of precursor in the target elements 306A-E so that process uniformity may be maintained.

In some embodiments, target elements 306A-E are arranged in parallel between gas distribution system 304 and vacuum manifold 308. In some embodiments, a vacuum pump maintains vacuum inside vacuum manifold 308 and there maintains vacuum inside target elements 306A-E. Precursor(s) and/or purge gas may flow in parallel from gas distribution system 304, through target elements 306A-E, to vacuum manifold 308. In some embodiments, spent precursor and/or purge gas may be collected in vacuum manifold 308 and sent to abatement fixture 310 for disposal.

Figure 4:
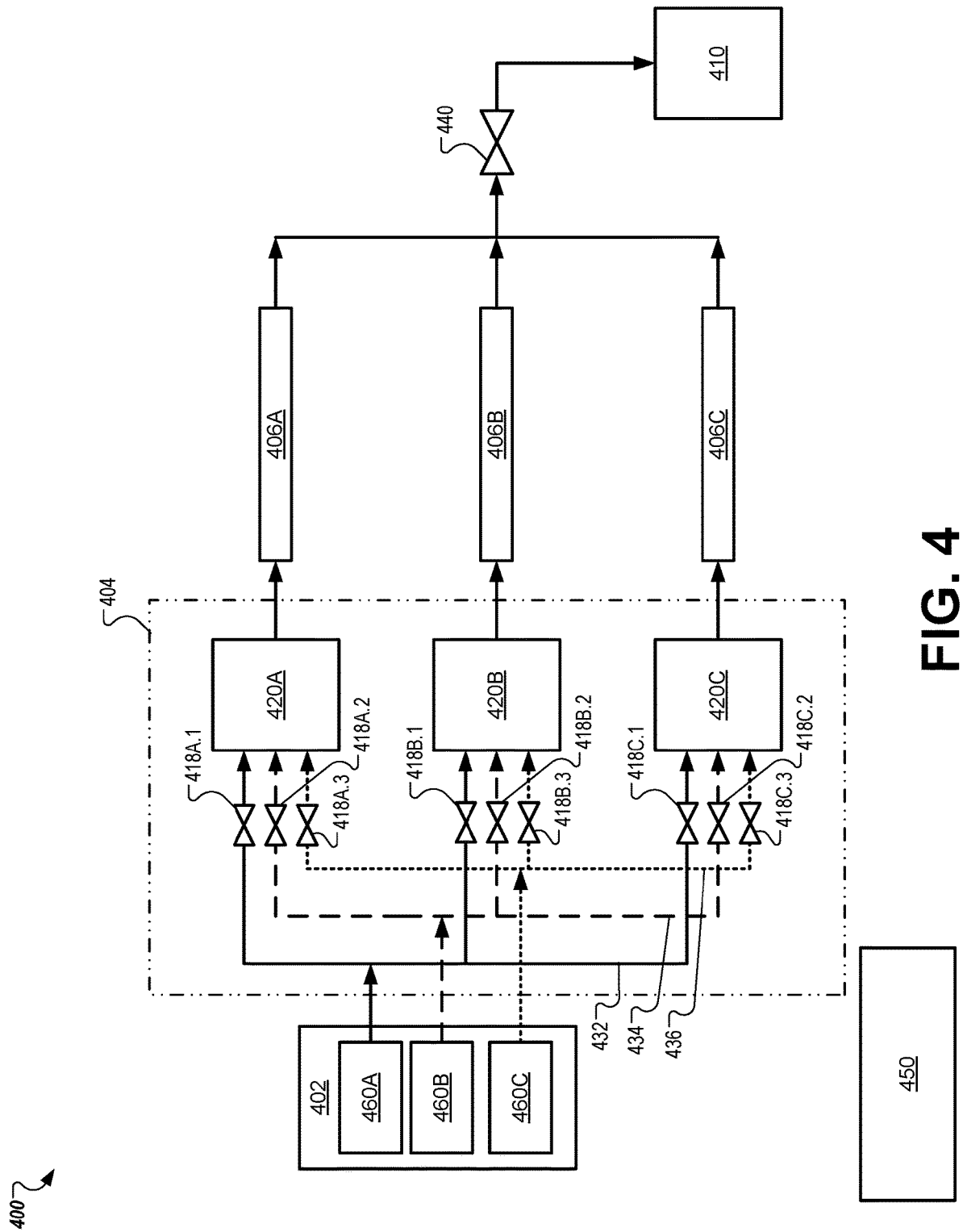
FIG. 4 illustrates a schematic diagram of a system for coating interiors of target elements with a protective coating, according to certain embodiments of the present disclosure.

FIG. 4 illustrates a schematic diagram of a system 400 for coating interiors of target elements with a protective coating, according to certain embodiments of the present disclosure. Features illustrate in FIG. 4 having similar numbering to features illustrated in other figures may have similar function and/or structure. FIG. 4 is shown with a set number of gas delivery lines and target elements. However, it should be understood that more or fewer gas delivery lines and/or target elements may also be used in some embodiments.

In some embodiments, a distribution panel 402 provides one or more precursors and/or a purge gas to distribution system 404. In some embodiments, distribution panel 402 includes a source 460A for a first precursor, a source 460B for a second precursor, and a source 460C for a purge gas. The precursors and/or purge gas may be delivered to distribution blocks 420A-C by one or more delivery lines. In some embodiments, target elements 406A-C are coupled to the distribution blocks 420A-C for receiving one or more precursors and/or purge gas. In some embodiments, a vacuum pump 410 may create vacuum within the target elements 406A-C. In some embodiments, a throttle valve 440 controls flow of spent precursor and/or purge gas from the target elements 406A-C to the vacuum pump. In some embodiments, controller 450 can control the position of throttle valve 440 (e.g., an open/closed position, or an intermediate position, etc.) to maintain a consistent vacuum pressure inside the target elements 406A-C. In some embodiments, target elements 406A-C are disposed within an oven. Heat inside the oven may at least partially cure one or more layers deposited on the interiors of the target elements 406A-C, according to embodiments described herein.

Controller 450 may control one or more components of distribution panel, throttle values, other valves, pumps, and so on, of distribution system 404. Controller 450 may be, e.g., a general purpose computer and/or may include a microprocessor or other suitable CPU (central processing unit), a memory for storing software routines that control electronic device manufacturing system, input/output peripherals, and support circuits (such as, e.g., power supplies, clock circuits, circuits for driving robot assembly 138, 136, a cache, and/or the like). Controller 450 may be programmed to, e.g., perform ALD to deposit protective layers on multiple target elements in parallel.

In some embodiments, the first precursor is delivered to distribution blocks 420A-C by first precursor delivery line 432. In some embodiments, the second precursor is delivered to distribution blocks 420A-C by second precursor delivery line 434. In some embodiments, the purge gas is delivered to distribution blocks 420A-C by purge gas delivery line 436. One or more valves 418 may control flow of the precursors and/or purge gas to the distribution blocks 420A-C. The one or more valves 418 may be controllable by the controller 450.

In some embodiments, controller 450 causes a rastering of pulsing of the first precursor inside the target elements 406A-C and/or rastering of pulsing of the second precursor inside the target elements 406A-C. In some embodiments, controller 450) causes 418A.1 to actuate to an open position to pulse the first precursor (e.g., from first precursor source 460A) inside target element 406A. In some embodiments, when valve 418A.1 is opened, first precursor flows into distribution block 420A, and then into target element 406A. In some embodiments, valve 418A.1 is opened for a length of time between approximately 10 milliseconds and approximately 50 milliseconds until controller 450 causes valve 418A.1 to be actuated to a closed position to stop the flow of first precursor. In some embodiments, subsequent to closure of valve 418A.1, controller 450 causes valve 418A.3 to actuate to an open position to purge the first precursor from the target element 406A. In some embodiments, when valve 418A.3 is opened, purge gas flows into distribution block 420A (e.g., from purge gas source 460C), and then intro target element 406A. Flowing purge gas into target element 406A may purge target element 406A of the first precursor. In some embodiments, valve 418A.3 is opened for a length of time between approximately 3 seconds and 9 seconds until controller 450 causes valve 418A.3 to be actuated to a closed position to stop the flow of purge gas. In some embodiments, valve 418A.3 may be opened for a sufficiently long duration so that target element 406A is completely purged of first precursor. In some embodiments, valve 418A.3 is opened for between approximately 4 seconds and approximately 7 seconds. In some embodiments, valve 418A.3 is opened for approximately 6 seconds. In some embodiments, subsequent to closure of valve 418A.3, controller causes valve 418A.2 to actuate to an open position to pulse the second precursor (e.g., from the second precursor source 460B) inside the target element 406A. In some embodiments, when valve 418A.2 is opened, second precursor flows into distribution block 420A, and then into target element 406A. In some embodiments, valve 418A.2 is opened for a length of time between approximately 10 milliseconds and approximately 50 milliseconds until controller 450 causes valve 418A.2 to be actuated to a closed position to stop the flow of second precursor. In some embodiments, subsequent to closure of valve 418A.2, controller causes valve 418A.3 to actuate to an open position to purge the second precursor from the target element 406A. Purging of the second precursor from the target element 406A may be similar to purging the first precursor, as described above. In some embodiments, the cycle of pulsing the first precursor, purging, flowing the second precursor, and again purging may be repeated multiple times to deposit a protective layer on the interior of target element 406A.

In some embodiments, controller 450 causes valve 418B.1 to actuate to an open position to pulse the first precursor inside target element 406B. In some embodiments, valve 418B.1 is opened subsequent to the opening of valve 418A.1. In some embodiments, opening and/or closing valve 418A.1 causes a pressure wave, a pressure disturbance, and/or a pressure variance inside first precursor delivery line 432. In some embodiments, to reduce and/or eliminate effects of the pressure wave, disturbance, variance, etc. in first precursor delivery line 432 on the pulsing of first precursor in target element 406B, valve 418B.1 is opened at an offset delayed time relative to the opening of valve 418A.1. In some embodiments, valve 418B.1 is opened at a time delay between approximately 100 milliseconds and approximately 500 milliseconds after the opening of valve 418A.1. In some embodiments, valve 418B.1 is opened at a time delay between approximately 200 milliseconds and approximately 400 milliseconds after the opening of valve 418A.1. In some embodiments, valve 418B.1 is opened at a time delay of approximately 300 milliseconds after the opening of valve 418A.1. Because valve 418A.1 is open for a length of time between approximately 10 milliseconds and approximately 50 milliseconds before closing, valve 418B.1 may be caused to be opened between approximately 50 milliseconds and 490 milliseconds after valve 418A.1 is closed. Delaying the opening of valve 418B.1 may allow for pressure waves, disturbances, and/or variances to settle inside first precursor delivery line 432 so that pulsing of the first precursor inside target element 406B is not adversely affected. In some embodiments, the pulsing of first precursor inside target element 406B overlaps in time with the purging of the first precursor from the target element 406A. In some embodiments, after the pulsing of the first precursor inside target element 406B, controller 450 may cause valve 418B.3 to acuate to an open position to flow purge gas (e.g., via distribution block 420B) to purge the first precursor from the target element 406B, and then controller 450) may cause valve 418B.2 to actuate to an open position to pulse the second precursor inside the target element 406B, after which controller 450 may cause valve 418B.3 to again be opened to flow purge gas to purge the second precursor from the target element 406B. In some embodiments, like described above with respect to target element 406A, the cycle of pulsing the first precursor, purging, flowing the second precursor, and again purging may be repeated multiple times to deposit a protective layer on the interior of target element 406B.

In some embodiments, controller 450 causes valve 418C.1 to actuate to an open position to pulse the first precursor inside target element 406C similar to as described above with respect to valve 418A.1 and valve 418B.1. In some embodiments, valve 418C.1 is opened at an offset time delay relative to valve 418B.1 in a substantially similar manner as described above with respect to valve 418B.1 and valve 418A.1 for the same reasons. In some embodiments, pulsing the first precursor inside target element 406C may overlap in time with purging the first precursor from target element 406A and/or purging the first precursor from target element 406B. In some embodiments, controller 450 may cause valve 418C.3 to open to flow purge gas in target element 406C to purge the first precursor, after which controller 450 may cause valve 418C.2 to open to flow second precursor in target element 406C (e.g., via distribution block 420C). In some embodiments, after pulsing the second precursor, controller 450) may cause valve 418C.3 to again be opened to flow purge gas to purge the second precursor from target element 406C. In some embodiments, like described above with respect to target elements 406A and 406B, the cycle of pulsing the first precursor, purging, flowing the second precursor, and again purging may be repeated multiple times to deposit a protective layer on the interior of target element 406C.

Figure 5:
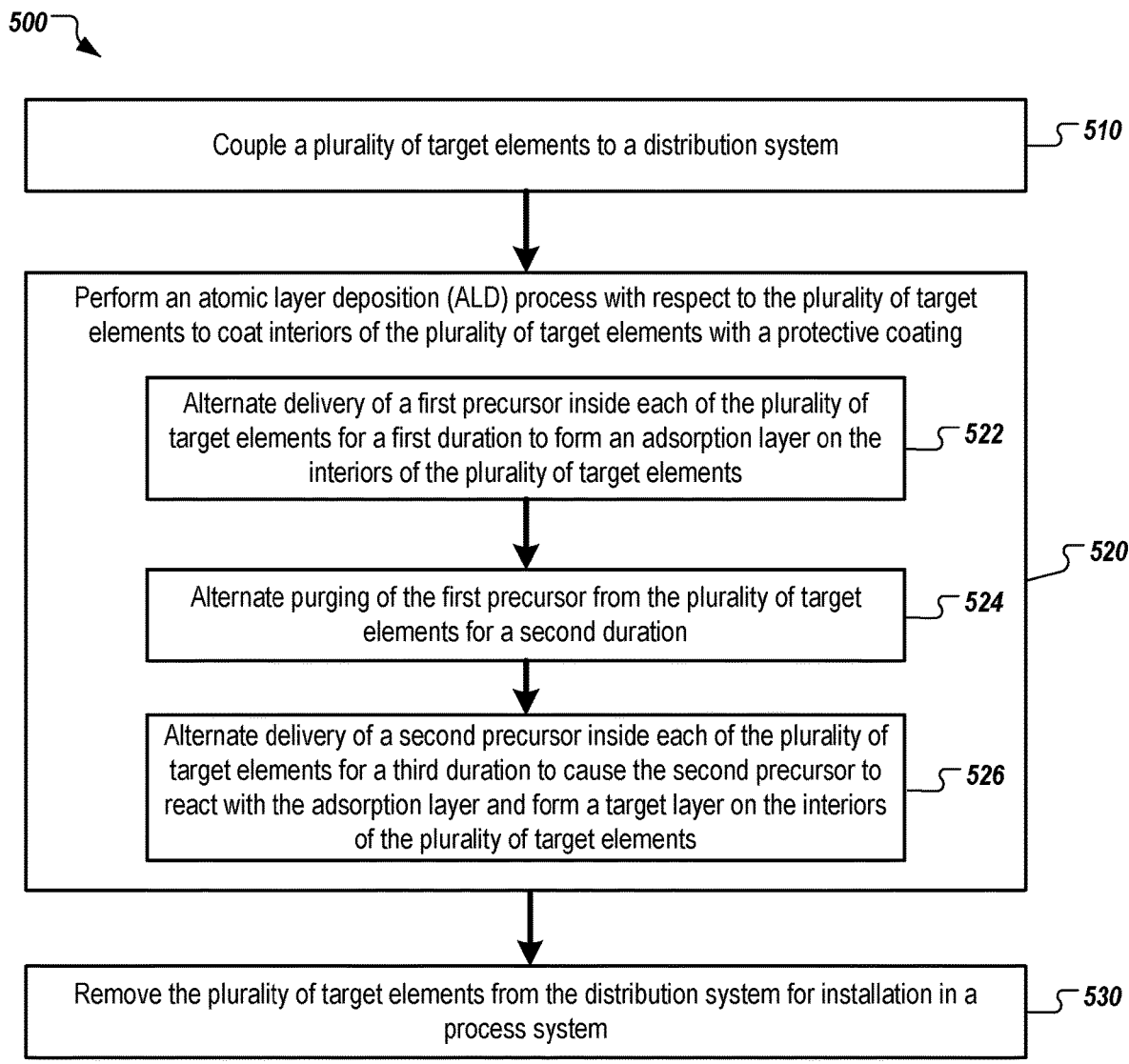
FIG. 5 illustrates a flow chart of a method for performing an ALD process to coat interiors of target elements with a protective coating, according to certain embodiments of the present disclosure.

FIG. 5 illustrates a flow chart of a method 500 for performing an ALD process to coat interiors of target elements with a protective coating, according to certain embodiments of the present disclosure. In some embodiments, the target elements are gas delivery tubes for a substrate processing system. In some embodiments, operations of method 500 are performed by one or more systems for depositing a protective coating on the interiors of one or more target elements as described herein, such as system 200 of FIG. 2, system 300 of FIG. 3, and/or system 400 of FIG. 4.

At bock 510, a plurality of target elements (e.g., gas delivery tubes) are coupled to a common distribution system. In some embodiments, the target elements are fluidly coupled to distribution blocks (e.g., distribution blocks 420A-C of FIG. 4) to receive one or more precursor and/or purge gas. In some embodiments, the target elements are coupled to the common distribution system in parallel with one another.

At block 520, an ALD process is performed with respect to the plurality of target elements to coat interiors of the plurality of target elements with a protective coating. In some embodiments, the protective coating is a corrosion-resistant coating. In some embodiments, the protective coating includes an aluminum oxide coating on one or more interior surface of the target elements.

At block 522, a first precursor is alternately delivered inside each of the target elements for a first duration. In some embodiments, delivering the first precursor inside the target elements causes the formation of an adsorption layer on the interiors of the target elements. In some embodiments, the first precursor is one of trimethyl aluminum (TMA) or aluminum chloride. In some embodiments, the first precursor is delivered for a time duration of between approximately 10 milliseconds and approximately 50 milliseconds. In some embodiments, the first precursor is pulsed inside the target elements. In some embodiments, pulsing the first precursor inside the target elements includes a rastering of pulsing. Rastering of pulsing may include pulsing the precursor inside a first target element, then pulsing the precursor inside a second target element, then pulsing the precursor inside a third target element, and so on. Rastering of pulsing may include introducing the precursor into the target elements in a predetermined sequencing.

At block 524, the first precursor is alternately purged from the target elements for a second duration. In some embodiments, a purge gas is flowed through the target elements to purge the first precursor from the target elements. In some embodiments, one or more valves are opened to cause purge gas to flow through the target elements. In some embodiments, the purge gas is an inert gas such as nitrogen. In some embodiments, purge gas is delivered for a time duration between approximately 3 seconds and approximately 9 seconds.

At block 526, a second precursor is alternately delivered inside each of the target elements for a third duration. In some embodiments, delivering the second precursor inside the target elements causes the second precursor to react with the adsorption layer and form a target layer on the interiors of the target elements. In some embodiments, the second precursor is water ($H_2O$) or ozone ($O_3$). In some embodiments, the second precursor is delivered for a time duration of between approximately 10 milliseconds and approximately 50 milliseconds. In some embodiments, the second precursor is pulsed inside the target elements. In some embodiments, pulsing the second precursor inside the target elements includes a rastering of pulsing. In some embodiments, blocks 522-526 may be repeated multiple times to build up layers of protective coating on the interior surface(s) of the target elements.

At block 530, the target elements are removed from the distribution system for installation in a process system such as a substrate process system. In some embodiments, the target elements removed from the distribution system have a protective coating (e.g., an aluminum oxide protective coating) on one or more interior surfaces.

Figure 6:
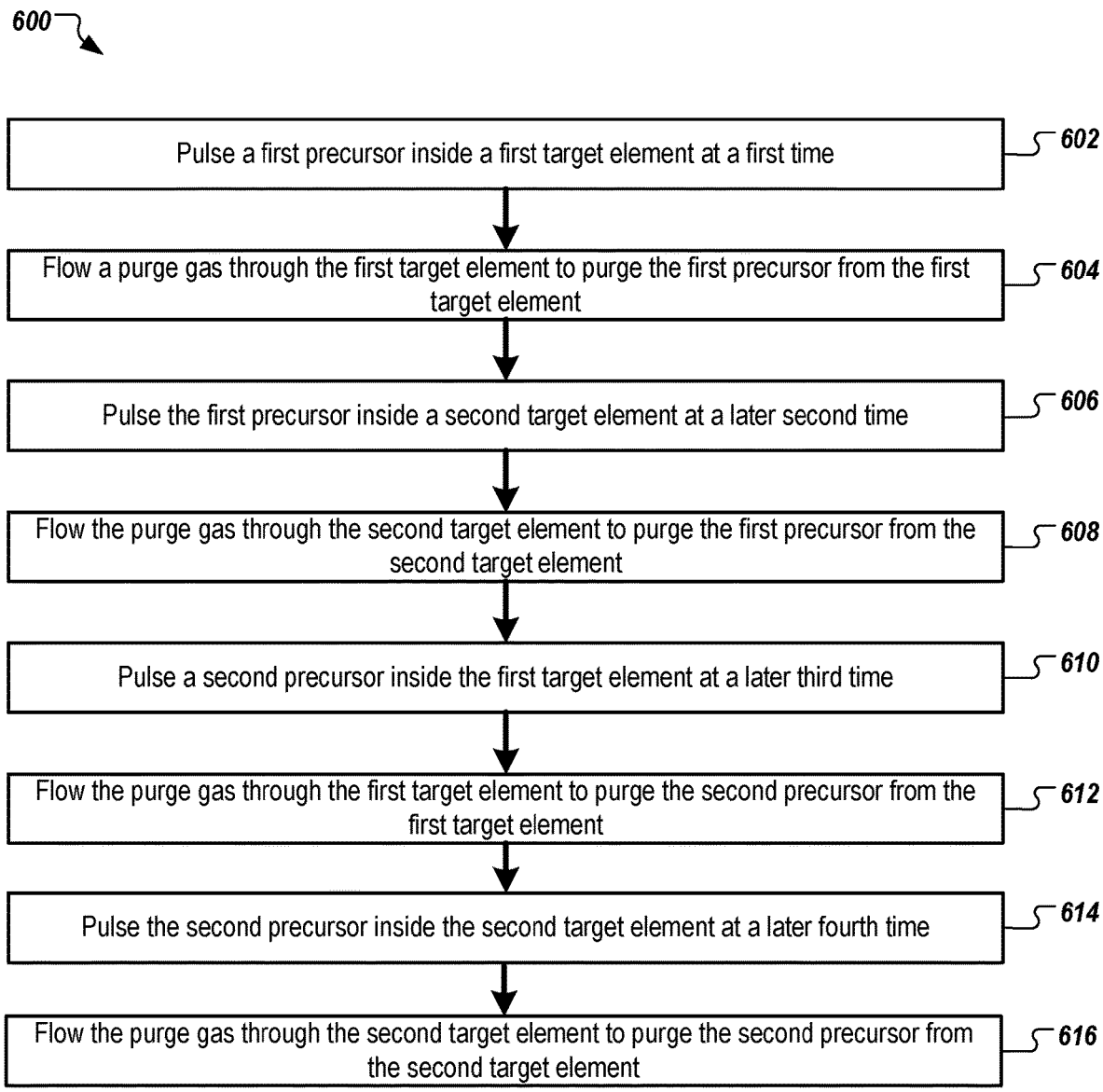
FIG. 6 illustrates a flow chart of a method for coating interiors of target elements with a protective coating, according to certain embodiments of the present disclosure.

FIG. 6 illustrates a flow chart of a method 600 for coating interiors of target elements with a protective coating, according to certain embodiments of the present disclosure. In some embodiments, operations of method 600 are performed by one or more systems for depositing a protective coating on the interiors of one or more target elements as described herein, such as system 200 of FIG. 2, system 300 of FIG. 3, and/or system 400 of FIG. 4.

At block 602, a first precursor is pulsed inside a first target element at a first time. In some embodiments, the first precursor is pulsed for a duration of between approximately 10 milliseconds and approximately 50 milliseconds. In some embodiments, the first precursor is one of trimethyl aluminum (TMA) or aluminum chloride.

At block 604, purge gas is flowed through the first target element to purge the first precursor from the first target element. In some embodiments, the purge gas is an inert gas. In some embodiments, the purge gas is nitrogen gas. In some embodiments, the purge gas is flowed through the first target element between approximately 3 seconds and approximately 9 seconds.

At block 606, the first precursor is pulsed inside a second target element at a later second time. In some embodiments, the difference between the first time and the later second time is between approximately 100 milliseconds and approximately 500 milliseconds. In some embodiments, pulsing the first precursor inside the second target element at least partially overlaps in time with purging the first precursor from the first target element at block 604.

At block 608, purge gas is flowed through the second target element to purge the first precursor from the second target element. In some embodiments, purging the first precursor from the second target element at least partially overlaps in time with purging the first precursor from the first target element at block 604.

At block 610, a second precursor is pulsed inside the first target element at a later third time. In some embodiments, the second precursor is pulsed for a duration of between approximately 10 milliseconds and approximately 50 milliseconds. In some embodiments, the second precursor is one of water ($H_2O$) or ozone ($O_3$). Pulsing the second precursor inside the first target element may at least partially overlap in time with purging the first precursor from the second target element and/or purging the first precursor from a third target element.

At block 612, purge gas is flowed through the first target element to purge the second precursor from the first target element. In some embodiments, purging the second precursor from the first target element may at least partially overlap in time with purging the first precursor from the second target element and/or purging the first precursor from a third target element.

At block 614, the second precursor is pulsed inside the second target element at a later fourth time. In some embodiments, the difference between the third time and the later fourth time is between approximately 100 milliseconds and approximately 500 milliseconds. In some embodiments, pulsing the second precursor inside the second target element at least partially overlaps in time with purging the second precursor from the first target element.

At block 616, purge gas is flowed through the second target element to purge the second precursor from the second target element. In some embodiments, purging the second precursor from the second target element may at least partially overlap in time with purging the second precursor from the first target element.

Figure 7:
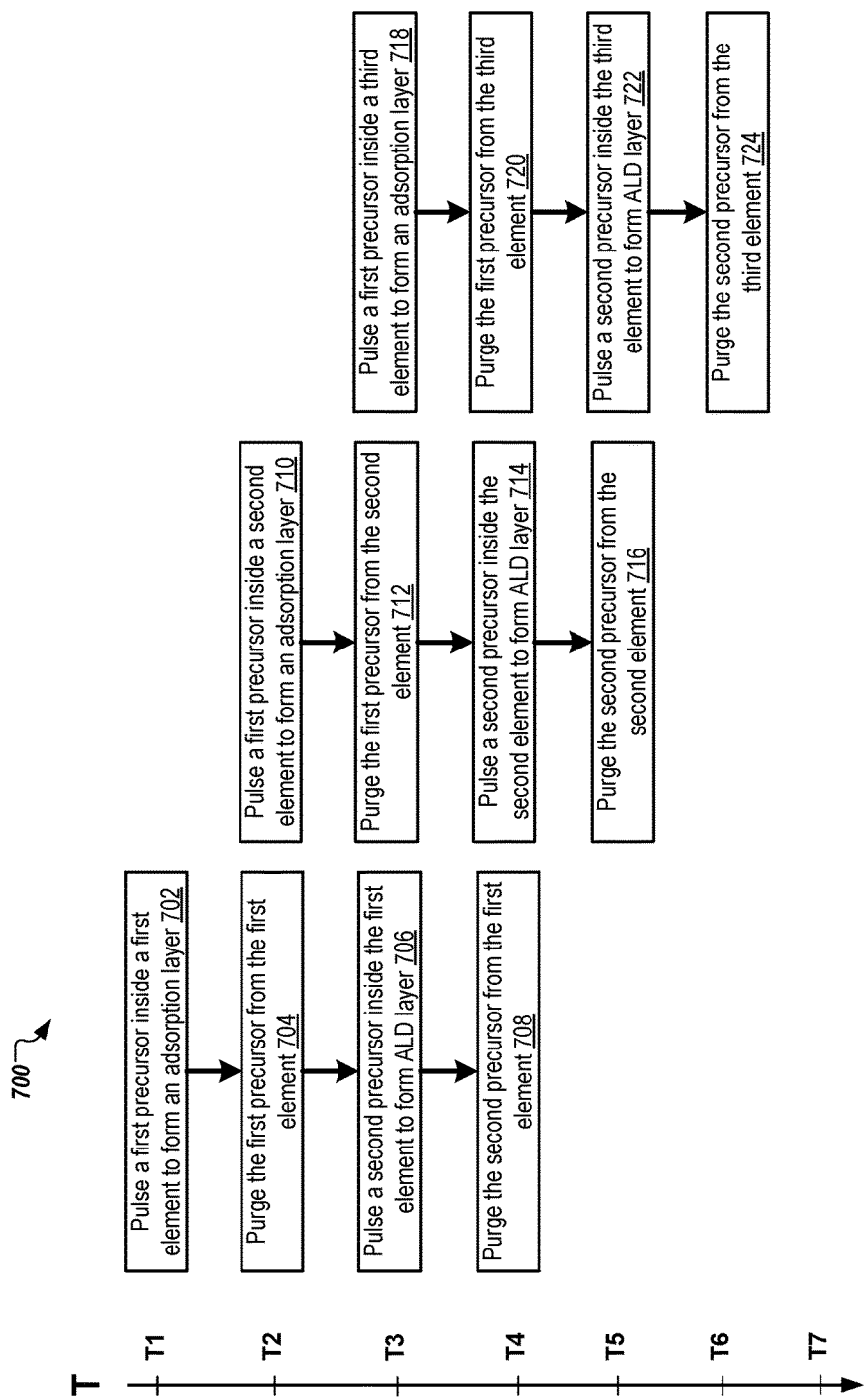
FIG. 7 illustrates a flow chart of a method for coating interiors of multiple target elements with a protective coating, according to certain embodiments of the present disclosure.

FIG. 7 illustrates a flow chart of a method 700 for coating interiors of multiple target elements with a protective coating, according to certain embodiments of the present disclosure. In some embodiments, operations of method 700 are performed by one or more systems for depositing a protective coating on the interiors of one or more target elements as described herein, such as system 200 of FIG. 2, system 300 of FIG. 3, and/or system 400 of FIG. 4.

At block 702, at time T1, a first precursor is pulsed inside a first element to form an adsorption layer. The adsorption layer may be formed on at least one interior surface of the first element. At block 704, at time T2, the first precursor is purged from the first element. A purge gas may be flowed through the first element to purge the first precursor. At block 706, at time T3, a second precursor is pulsed inside the first element to form an ALD layer. The second precursor may react with the adsorption layer (formed at block 702) to form the ALD layer. The ALD layer may be formed on the at least one interior surface of the first element. The ALD layer may be a protective coating layer as described herein. At block 708, at time T4, the second precursor is purged from the first element. Blocks 702-708 may be repeated (e.g., starting again at time T5) to form further ALD layers on the interior of the first element.

At block 710, at time T2, the first precursor is pulsed inside a second element to form an adsorption layer (e.g., on at least one interior surface of the second element). At block 712, at time T3, the first precursor is purged from the second element (e.g., by a purge gas flowed through the second element). At block 714, at time T4, the second precursor is pulsed inside the second element to form an ALD layer (e.g., on the at least one interior surface of the second element). At block 716, the second precursor is purged from the second element (e.g., by flowing a purge gas through the second element). Blocks 710-716 may be repeated (e.g., starting again at time T6) to form further ALD layers on the interior of the second element.

At block 718, at time T3, the first precursor is pulsed inside a third element to form an adsorption layer. At block 720, at time T4, the first precursor is purged from the third element. At block 722, at time T5, the second precursor is pulsed inside the third element to form an ALD layer. At block 724, at time T6, the second precursor is purged from the third element. Blocks 718-724 may be repeated (e.g., starting again at time T7) to form further ALD layers on the interior of the third element.

Figure 8:
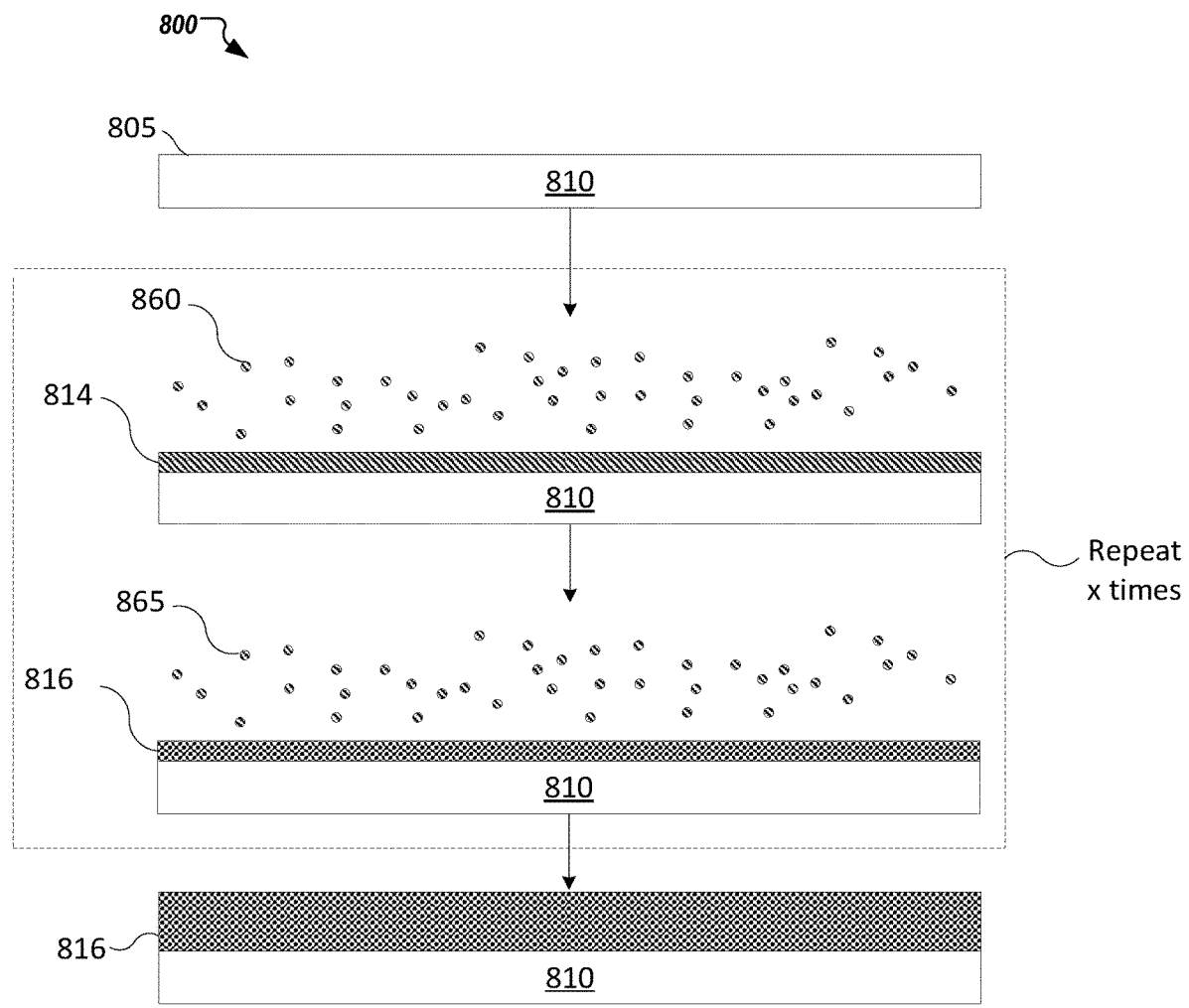
FIG. 8 depicts a deposition process in accordance with an ALD process, according to certain embodiments of the present disclosure.

FIG. 8 depicts a deposition process 800 in accordance with an ALD process, according to certain embodiments of the present disclosure. Various types of ALD processes exist and the specific type may be selected based on several factors such as the surface to be coated, the coating material, chemical interaction between the surface and the coating material, etc. The general principle for the various ALD processes comprises growing a thin film layer by repeatedly exposing the surface to be coated to pulses of gaseous chemical precursors that chemically react with the surface one at a time in a self-limiting manner.

An article 810 is illustrated having a surface. Article 810 may represent various components (e.g., substrate process system components) including but not limited to an interior surface of a gas delivery tube. The article 810 may be made from a ceramic, a metal-ceramic composite (such as AlO/SiO, AlO/MgO/SiO, SiC, SiN, AlN/SiO and the like), a metal (such as aluminum, stainless steel), a polymer, a polymer ceramic composite, mylar, polyester, or other suitable materials, and may further comprise materials such as AlN, Si, SiC, $Al_2O_3$, $SiO_2$, and so on. In one embodiment, the article 810 is gas delivery tube composed of a stainless steel material.

For ALD, either adsorption of a precursor onto a surface or a reaction of a reactant with the adsorbed precursor may be referred to as a "half-reaction." During a first half reaction, a precursor is pulsed onto the surface of the article 810 for a period of time sufficient to allow the precursor to fully adsorb onto the surface. The adsorption is self-limiting as the precursor will adsorb onto a finite number of available sites on the surface, forming a uniform continuous adsorption layer on the surface. Any sites that have already adsorbed with a precursor will become unavailable for further adsorption with the same precursor unless and/or until the adsorbed sites are subjected to a treatment that will form new available sites on the uniform continuous coating. Exemplary treatments may be plasma treatment, treatment by exposing the uniform continuous adsorption layer to radicals, or introduction of a different precursor able to react with the most recent uniform continuous layer adsorbed to the surface.

In some implementations, two or more precursors are injected together and adsorbed onto the surface of an article. The excess precursors are pumped out until an oxygen-containing reactant is injected to react with the adsorbates to form a solid single phase or multi-phase layer (e.g., of aluminum oxide, etc.). This fresh layer is ready to adsorb the precursors in the next cycle.

As shown in FIG. 8, article 810 may be introduced to a first precursor 860 for a first duration until a surface of article 810 is fully adsorbed with the first precursor 860 to form an adsorption layer 814. Subsequently, article 810 may be introduced to a first reactant 865 to react with the adsorption layer 814 to grow a solid layer 816 (e.g., so that the layer 816 is fully grown or deposited, where the terms grown and deposited may be used interchangeably herein). The first precursor 860 may be a precursor for a high purity metal oxide, for example, high purity aluminum oxide, yttrium oxide, zirconium oxide, erbium oxide, and so on. The first reactant 865 may be oxygen, water vapor, ozone, pure oxygen, oxygen radicals, or another oxygen source if the layer 816 is an oxide. Alternatively, the first reactant 865 may be a fluorine source. Accordingly, ALD may be used to form the layer 816. The layer 816 may be a corrosion resistant coating, or may be one layer of a multi-layer corrosion resistant coating.

In an example where the layer 816 is a high purity aluminum oxide layer, article 810 (e.g., a gas delivery tube for a substrate processing system) may be introduced to a first precursor 860 (e.g., trimethyl aluminum (TMA), or aluminum chloride) for a first duration until all the reactive sites on the article's surfaces (including inside the pores) are consumed. The remaining first precursor 860 is flushed away and then a first reactant 865 of $H_2O$ or $O_3$ is injected into the reactor to start the second half cycle. A layer 816 of HP—$Al_2O_3$ is formed after $H_2O$ or $O_3$ molecules react with the Al containing adsorption layer created by the first half reaction.

Layer 816 may be uniform, continuous and conformal. Layer 816 may be porosity free (e.g., have a porosity of zero) or have an approximately zero porosity in embodiments (e.g., a porosity of 0% to 0.01%). Layer 816 may have a thickness of less than one atomic layer to a few atoms in some embodiments after a single ALD deposition cycle. Some metalorganic precursor molecules are large. After reacting with the reactant 865, large organic ligands may be gone, leaving much smaller metal atoms. One full ALD cycle (e.g., that includes introduction of precursors 860 followed by introduction of reactants 265) may result in less than a single atomic layer. For example, an $Al_2O_3$ monolayer grown by TMA and $H_2O$ typically has a growth rate of about 0.9 A/cycle to about 1.3 A/cycle while the $Al_2O_3$ lattice constant is a −4.7 A and c=13A (for a trigonal structure).

Multiple full ALD deposition cycles may be implemented to deposit a thicker layer 816, with each full cycle (e.g., including introducing precursor 860, flushing, introducing reactant 865, and again flushing) adding to the thickness by an additional fraction of an atom to a few atoms. As shown, up to x full cycles may be performed to grow the layer 816, where x is an integer value greater than 1. In some embodiments, layer 816 may have a thickness of about 5 nm to about 3 μm. In some embodiments, layer 816 has a thickness of about 5 nm to about 300 nm. Layer 816 may have a thickness of about 10 nm to about 150 nm in embodiments or about 50 nm to about 100 nm in other embodiments.

The layer 816 provides robust corrosion resistance and mechanical properties. Layer 816 may protect the component from corrosion, enhance dielectric strength, provide better adhesion of a rare-earth metal-containing oxide layer to the component (e.g., formed of porous ceramic or A16061, A16063), and may prevent cracking of the corrosion resistant coating at temperatures up to about 200° C., or up to about 250° C., or from about 200° C. to about 250° C. In further embodiments, the layer 816 may prevent cracking of the corrosion resistant coating at temperatures of up to about 350° C. Since ALD is used for the deposition, the internal surfaces of high aspect ratio features or pores in a porous material may be coated, and thus an entirety of a component may be protected from exposure to a corrosive environment.

Layer 816 may be HP—$Al_2O_3$, having a purity of about 89.99% to about 99.99%, in some embodiments. High purity $Al_2O_3$ is significantly more resistant to plasma corrosion than typical ceramic materials used for ESC plugs. Moreover, HP-$Al_2O_3$ has good adhesion to ceramic and aluminum based components because of common elements (e.g., aluminum and oxygen). Similarly, HP-$Al_2O_3$ has good adhesion to rare earth metal-containing oxides also because of common elements (i.e., the oxides). These improved interfaces reduce interfacial defects which are prone to initiate cracks.

Figure 9:
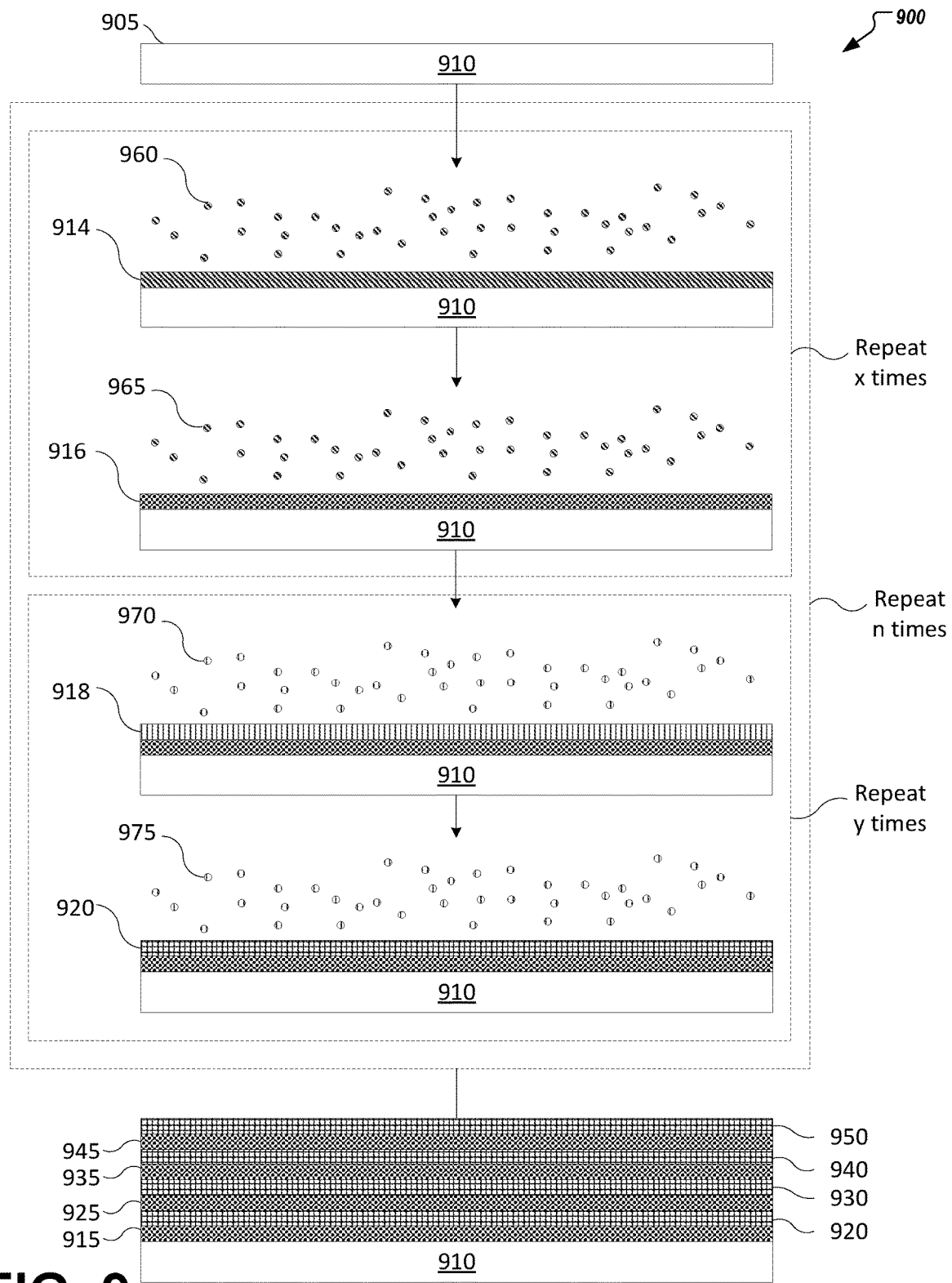
FIG. 9 depicts a deposition process in accordance with a variety of ALD techniques, according to certain embodiments of the present disclosure.

FIG. 9 depicts a deposition process 900 in accordance with a variety of ALD techniques, according to certain embodiments of the present disclosure. Various types of ALD processes exist and the specific type may be selected based on several factors such as the surface to be coated, the coating material, chemical interaction between the surface and the coating material, etc. The general principle for the various ALD processes comprises growing a thin film layer by repeatedly exposing the surface to be coated to sequential alternating pulses of gaseous chemical precursors that chemically react with the surface one at a time in a self-limiting manner.

An article 910 is illustrated having a surface 905. Article 910 may represent various semiconductor process system components including but not limited to substrate support assembly, an electrostatic chuck (ESC), a ring (e.g., a process kit ring or single ring), a chamber wall, a base, a gas distribution plate, gas lines (e.g., gas delivery lines), a showerhead, a nozzle, a lid, a liner, a liner kit, a shield, a plasma screen, a flow equalizer, a cooling base, a chamber viewport, a chamber lid, and so on. The article 910 and surface 905 may be made from a metal (such as aluminum, stainless steel), a ceramic, a metal-ceramic composite, a polymer, a polymer ceramic composite, or other suitable materials, and may further comprise materials such as AlN, Si, SiC, $Al_2O_3$, $SiO_2$, and so on.

Each individual chemical reaction between a precursor and the surface is known as a "half-reaction." During each half reaction, a precursor is pulsed onto the surface for a period of time sufficient to allow the precursor to fully react with the surface. The reaction is self-limiting as the precursor will only react with a finite number of available reactive sites on the surface, forming a uniform continuous adsorption layer on the surface. Any sites that have already reacted with a precursor will become unavailable for further reaction with the same precursor unless and/or until the reacted sites are subjected to a treatment that will form new reactive sites on the uniform continuous coating. Exemplary treatments may be plasma treatment, treatment by exposing the uniform continuous adsorption layer to radicals, or introduction of a different precursor able to react with the most recent uniform continuous film layer adsorbed to the surface.

In FIG. 9, article 910 having surface 905 may be introduced to a first precursor 960 for a first duration until a first half reaction of the first precursor 960 with surface 905 partially forms layer 915 by forming an adsorption layer 914. Subsequently, article 910 may be introduced to a second precursor 965 (also referred to as a reactant) to cause a second half reaction to react with the adsorption layer 914 and fully form the layer 915. The first precursor 960 may be a precursor for aluminum, yttrium, zirconium, erbium, or another metal, for example. The second precursor 965 may be an oxygen precursor if the layer 915 is an oxide or a fluorine precursor if the layer 915 is a fluoride. Layer 915 may be uniform, continuous and conformal. The article 910 may alternately be exposed to the first precursor 960 and second precursor 965 up to x number of times to achieve a target thickness for the layer 915. X may be an integer from 1 to 100, for example.

Subsequently, article 910 having surface 905 and layer 915 may be introduced to a third precursor 970 that reacts with layer 915 to partially form a second layer 920 by forming a second adsorption layer 918. The third precursor 970 may be a precursor for a material different from that of the first layer, such as aluminum, yttrium, zirconium, erbium, and so on. Subsequently, article 910 may be introduced to another precursor 975 (also referred to as a reactant) to cause a second half reaction to fully form the layer 920. The precursor 975 may be an oxygen source or a fluorine source. The second film layer 920 may be uniform, continuous and conformal. The article 910 may alternately be exposed to the third precursor 970 and fourth precursor 975 up to y number of times to achieve a target thickness for the layer 920. Y may be an integer from 1 to 100, for example.

Thereafter, the sequence of introducing the article 910 to precursors 960 and 965 x number of times and then to precursors 970 and 975 y number of times may be repeated and performed n number of times. N may be an integer from 1 to 100, for example. A result of the sequence may be to grow additional alternating layers 925, 930, 935, 940, 945, and 950. The number and thickness of the layers may be selected based on the targeted coating thickness and properties. The various layers may remain intact or in some embodiments may be interdiffused. In some embodiments, annealing is performed at an increased temperature to cause the alternating layers to interdiffuse and form a homogenous coating.

The surface reactions (e.g., half-reactions) are done sequentially. Prior to introduction of a new precursor, the chamber in which the ALD process takes place may be purged with an inert carrier gas (such as nitrogen or air) to remove any unreacted precursor and/or surface-precursor reaction byproducts. At least two precursors are used. In some embodiments, more than two precursors may be used to grow film layers having the same composition (e.g., to grow multiple layers of $Y_2O_3$ on top of each other). In other embodiments, different precursors may be used to grow different film layers having different compositions.

ALD processes may be conducted at various temperatures depending on the type of ALD process. The optimal temperature range for a particular ALD process is referred to as the "ALD temperature window." Temperatures below the ALD temperature window may result in poor growth rates and non-ALD type deposition. Temperatures above the ALD temperature window may result in thermal decomposition of the article or rapid desorption of the precursor. The ALD temperature window may range from about 20° C. to about 400° C. In some embodiments, the ALD temperature window is between about 150-350° C.

The ALD process allows for conformal film layers having uniform film thickness on articles and surfaces having complex geometric shapes, holes with large aspect ratios, and three-dimensional structures. Sufficient exposure time of the precursor to the surface enables the precursor to disperse and fully react with the surface in its entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in-situ on demand material synthesis of a particular composition or formulation without the need for a lengthy and difficult fabrication of source materials (such as powder feedstock and sintered targets).

With the ALD technique, multi-component films such as $YO_xF_y$, $YAl_xO_y$, $YZr_xO_y$, and $YZr_xAl_yO_z$ can be grown, for example, by proper sequencing of the precursors used to grow $Y_2O_3$, $Al_2O_3$, $YF_3$, and $ZrO_2$, as illustrated in more detail in the examples below.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single operation.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
    performing an atomic layer deposition (ALD) process with respect to a plurality of components, each component comprising a target element, to coat interiors of the target elements of the plurality of components with a protective coating, wherein performing the ALD process comprises:
        alternating delivery of a first precursor inside each of the target elements for a first duration to form an adsorption layer on the interiors of the target elements;
        alternating purging of the first precursor from the target elements for a second duration, wherein the purging is performed for a first interior of a first target element while delivery of the first precursor is performed for a second interior of a second target element; and
        alternating delivery of a second precursor inside each of the target elements for a third duration to cause the second precursor to react with the adsorption layer and form a target layer on the interiors of the target elements, wherein the delivery of the second precursor is performed for the first interior of the first target element while purging is performed for the second interior of the second target element or a third interior of a third target element.

2. The method of claim 1, wherein alternating delivery of the first precursor comprises:
    pulsing the first precursor inside the first interior of the first target element at a first time; and
    pulsing the first precursor inside the second interior of the second target element at a later second time, wherein a first difference between the first time and the second time comprises an offset delay.

3. The method of claim 2, wherein alternating delivery of the second precursor comprises:
    pulsing the second precursor inside the first interior of the first target element at a later third time; and
    pulsing the second precursor inside the second interior of the second target element at a later fourth time, wherein a second difference between the third time and the fourth time comprises the offset delay.

4. The method of claim 3, wherein alternating purging of the first precursor comprises:
    flowing a purge gas inside the first interior of the first target element subsequent to the first time until the third time; and
    flowing the purge gas inside the second interior of the second target element subsequent to the second time until the fourth time.

5. The method of claim 2, wherein the offset delay comprises a time delay between 100 milliseconds and 500 milliseconds.

6. The method of claim 1, wherein one or more of the first duration or the third duration comprises a length of time between 10 milliseconds and 50 milliseconds.

7. The method of claim 1, wherein the second duration comprises a length of time between 3 seconds and 9 seconds.

8. The method of claim 1, wherein:
    alternating delivery of the first precursor comprises opening one or more first valves for the first duration to cause the first precursor to flow to each of the target elements;
    alternating delivery of the second precursor comprises opening one or more second valves for the third duration to cause the second precursor to flow to each of the target elements; and
    alternating purging of the first precursor comprises opening one or more third valves for the second duration to cause purge gas to flow to each of the target elements.

9. The method of claim 1, wherein the interiors of the target elements are fluidly coupled in parallel with one another to receive the first precursor, a purge gas, and the second precursor from a common distribution system.

10. The method of claim 1, wherein the protective coating comprises an aluminum oxide coating on one or more interior surfaces of the target elements.

11. The method of claim 1, wherein the first precursor comprises one of trimethyl aluminum (TMA) or aluminum chloride, wherein the second precursor comprises one of water ($H_2O$) or ozone ($O_3$).

12. The method of claim 1, wherein alternating purging of the first precursor comprises flowing a purge gas comprising nitrogen.

13. The method of claim 1, wherein a target element comprises a gas delivery tube configured to deliver a process gas to a process chamber.

14. The method of claim 1, wherein alternating delivery of the first precursor inside each of the interiors of the target elements comprises a first rastering of pulsing of the first precursor, and wherein alternating delivery of the second precursor comprises a second rastering of pulsing of the second precursor.

* * * * *